United States Patent [19]

Chakradhar et al.

[11] Patent Number: 5,377,201
[45] Date of Patent: Dec. 27, 1994

[54] TRANSITIVE CLOSURE BASED PROCESS FOR GENERATING TEST VECTORS FOR VLSI CIRCUIT

[75] Inventors: Srimat Chakradhar, No. Brunswick; Viswani Agrawal, Murray Hill, both of N.J.

[73] Assignees: NEC Research Institute, Inc., Princeton, N.J.; AT&T Corp., New York, N.Y.

[21] Appl. No.: 813,144

[22] Filed: Dec. 19, 1991

Related U.S. Application Data

[63] Continuation-in-part of Ser. No. 717,081, Jun. 18, 1991, abandoned.

[51] Int. Cl.5 .............................................. G01R 31/28
[52] U.S. Cl. ......................................... 371/23; 371/27
[58] Field of Search ..................... 371/27, 23; 395/575

[56] References Cited

U.S. PATENT DOCUMENTS

| | | | |
|---|---|---|---|
| 4,692,921 | 9/1987 | Dahbura et al. | 371/27 |
| 4,853,928 | 8/1989 | Williams | 371/27 |
| 4,930,072 | 5/1990 | Agrawai et al. | 364/200 |
| 5,010,552 | 4/1991 | Dias et al. | 371/27 |
| 5,257,268 | 10/1993 | Agrawal et al. | 371/27 |

Primary Examiner—Charles E. Atkinson
Attorney, Agent, or Firm—Arthur J. Torsiglieri

[57] ABSTRACT

A process for generating a vector for testing a digital circuit for a given fault first creates a composite circuit including a fault-present version of the circuit and a fault-free version. An implication graph is developed for the composite circuit and its energy function is derived as a combination of binary and ternary terms. All signal states that are consistent with the circuit function minimize the energy function to zero value. The transitive closure is computed for the binary terms, and redundancies, contradictions, fixations, identification and exclusions are identified. By iteration of implication graphs and transitive closures together with arbitrarily assigned signal values all ternary terms of the energy function are converted to binary terms, after which transitive closure recomputes a set of literals that can be used to generate the desired test vector by a standard branch and bound procedure.

3 Claims, 13 Drawing Sheets

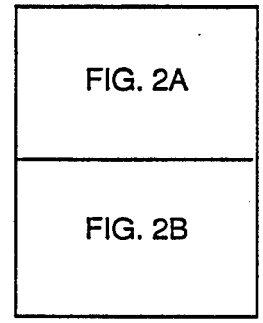
FIGURE 3
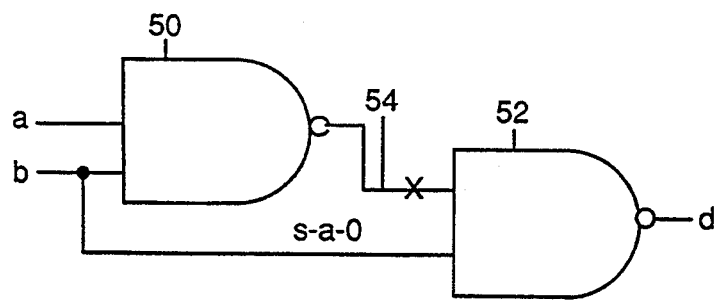
FIGURE 4
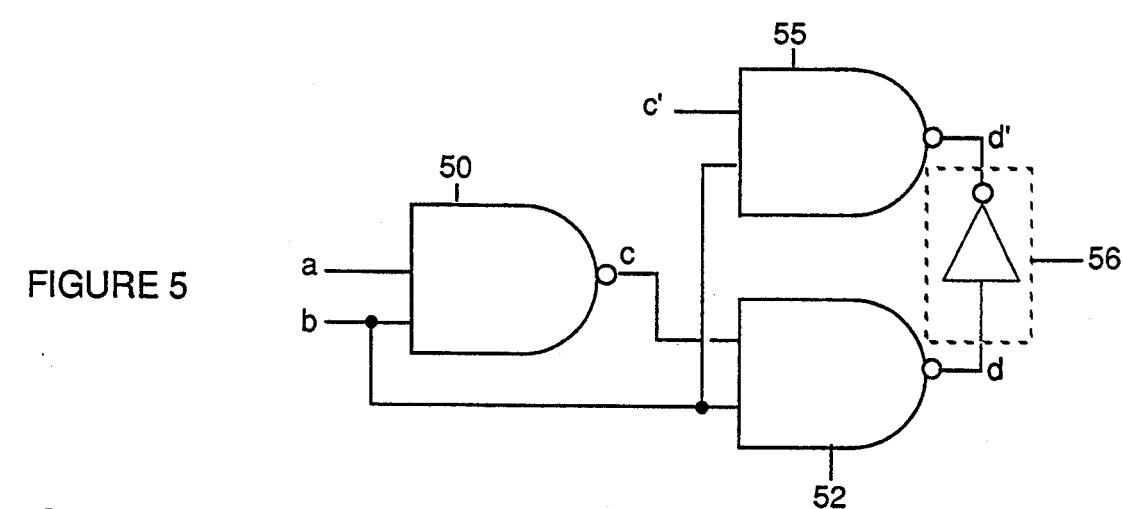
FIGURE 5
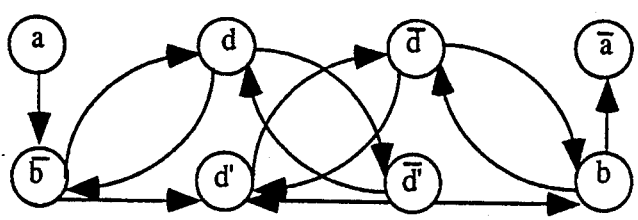
FIGURE 6
|   | a | ā | b | b̄ | d | d̄ | d' | d̄' |
|---|---|---|---|---|---|---|---|---|
| a | 1 | 1 | 1 | 1 | 1 | 1 | 1 | 1 |
| ā | 0 | 1 | 0 | 0 | 0 | 0 | 0 | 0 |
| b | 0 | 1 | 1 | 0 | 0 | 1 | 1 | 0 |
| b̄ | 0 | 1 | 1 | 1 | 1 | 1 | 1 | 1 |
| d | 0 | 1 | 1 | 1 | 1 | 1 | 1 | 1 |
| d̄ | 0 | 1 | 1 | 0 | 0 | 1 | 1 | 0 |
| d' | 0 | 1 | 1 | 0 | 0 | 1 | 1 | 0 |
| d̄' | 0 | 1 | 1 | 1 | 1 | 1 | 1 | 1 |
FIGURE 7

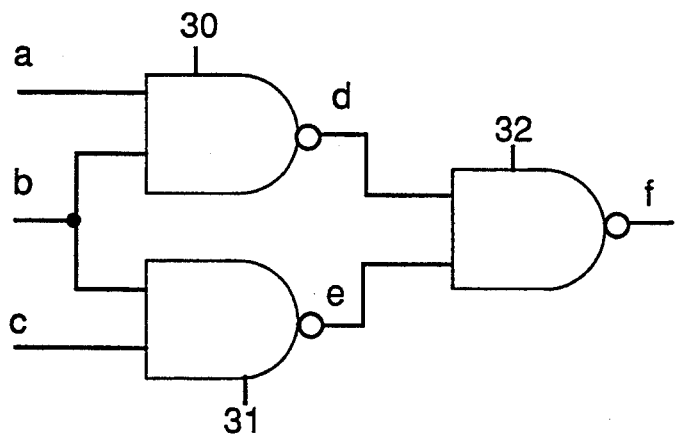
FIGURE 8
FIGURE 9
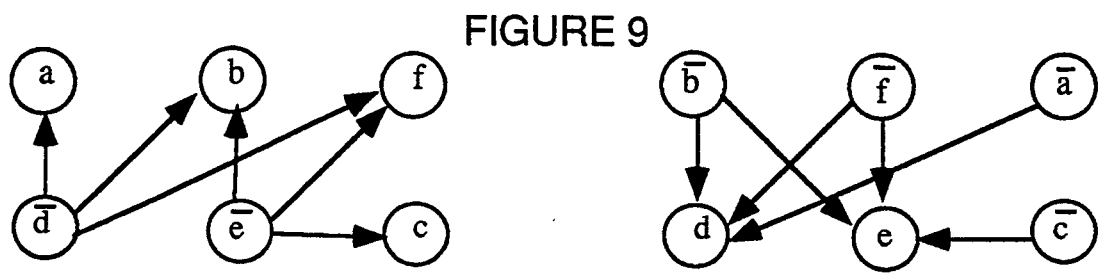
|   | a | $\bar{a}$ | b | $\bar{b}$ | c | $\bar{c}$ | d | $\bar{d}$ | e | $\bar{e}$ | f | $\bar{f}$ |
|---|---|---|---|---|---|---|---|---|---|---|---|---|
| a | 1 | 0 | 0 | 0 | 0 | 0 | 0 | 0 | 0 | 0 | 0 | 0 |
| $\bar{a}$ | 0 | 1 | 0 | 0 | 0 | 0 | 1 | 0 | 0 | 0 | 0 | 0 |
| b | 0 | 0 | 1 | 0 | 0 | 0 | 0 | 0 | 0 | 0 | 0 | 0 |
| $\bar{b}$ | 0 | 0 | 0 | 1 | 0 | 0 | 1 | 0 | 1 | 0 | 0 | 0 |
| c | 0 | 0 | 0 | 0 | 1 | 0 | 0 | 0 | 0 | 0 | 0 | 0 |
| $\bar{c}$ | 0 | 0 | 0 | 0 | 0 | 1 | 0 | 0 | 1 | 0 | 0 | 0 |
| d | 0 | 0 | 0 | 0 | 0 | 0 | 1 | 0 | 0 | 0 | 0 | 0 |
| $\bar{d}$ | 1 | 0 | 1 | 0 | 0 | 0 | 0 | 1 | 0 | 0 | 1 | 0 |
| e | 0 | 0 | 0 | 0 | 0 | 0 | 0 | 0 | 1 | 0 | 0 | 0 |
| $\bar{e}$ | 0 | 0 | 1 | 0 | 1 | 0 | 0 | 0 | 0 | 1 | 1 | 0 |
| f | 0 | 0 | 0 | 0 | 0 | 0 | 0 | 0 | 0 | 0 | 1 | 0 |
| $\bar{f}$ | 0 | 0 | 0 | 0 | 0 | 0 | 1 | 0 | 1 | 0 | 0 | 1 |
FIGURE 10
FIGURE 11
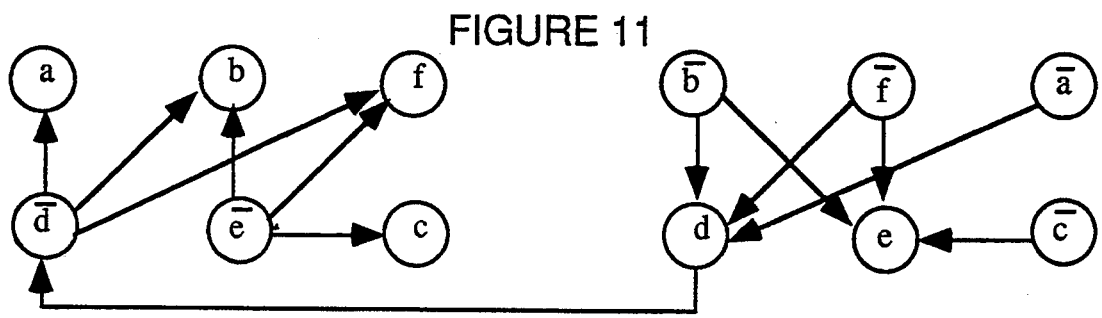

|   | a | ā | b | b̄ | c | c̄ | d | d̄ | e | ē | f | f̄ |
|---|---|---|---|---|---|---|---|---|---|---|---|---|
| a  | 1 | 0 | 0 | 0 | 0 | 0 | 0 | 0 | 0 | 0 | 0 | 0 |
| ā  | 1 | 1 | 1 | 0 | 0 | 0 | 1 | 1 | 0 | 0 | 1 | 0 |
| b  | 0 | 0 | 1 | 0 | 0 | 0 | 0 | 0 | 0 | 0 | 0 | 0 |
| b̄  | 1 | 0 | 1 | 1 | 0 | 0 | 1 | 1 | 1 | 0 | 1 | 0 |
| c  | 0 | 0 | 0 | 0 | 1 | 0 | 0 | 0 | 0 | 0 | 0 | 0 |
| c̄  | 0 | 0 | 0 | 0 | 0 | 1 | 0 | 0 | 1 | 0 | 0 | 0 |
| d  | 1 | 0 | 1 | 0 | 0 | 0 | 1 | 1 | 0 | 0 | 1 | 0 |
| d̄  | 1 | 0 | 1 | 0 | 0 | 0 | 0 | 1 | 0 | 0 | 1 | 0 |
| e  | 0 | 0 | 0 | 0 | 0 | 0 | 0 | 0 | 1 | 0 | 0 | 0 |
| ē  | 0 | 0 | 1 | 0 | 1 | 0 | 0 | 0 | 0 | 1 | 1 | 0 |
| f  | 0 | 0 | 0 | 0 | 0 | 0 | 0 | 0 | 0 | 0 | 1 | 0 |
| f̄  | 1 | 0 | 1 | 0 | 0 | 0 | 1 | 1 | 1 | 0 | 1 | 1 |

|   | a | ā | b | b̄ | c | c̄ | d | d̄ | e | ē | f | f̄ |
|---|---|---|---|---|---|---|---|---|---|---|---|---|
| a  | 1 | 0 | 0 | 0 | 0 | 0 | 0 | 0 | 0 | 0 | 0 | 0 |
| ā  | 0 | 1 | 1 | 0 | 1 | 0 | 1 | 0 | 0 | 1 | 1 | 0 |
| b  | 0 | 0 | 1 | 0 | 0 | 0 | 0 | 0 | 0 | 0 | 0 | 0 |
| b̄  | 1 | 0 | 1 | 1 | 1 | 0 | 1 | 1 | 1 | 1 | 1 | 0 |
| c  | 0 | 0 | 0 | 0 | 1 | 0 | 0 | 0 | 0 | 0 | 0 | 0 |
| c̄  | 1 | 0 | 1 | 0 | 0 | 1 | 0 | 1 | 1 | 0 | 1 | 0 |
| d  | 0 | 0 | 1 | 0 | 1 | 0 | 1 | 0 | 1 | 0 | 1 | 0 |
| d̄  | 1 | 0 | 1 | 0 | 0 | 0 | 0 | 1 | 0 | 0 | 1 | 0 |
| e  | 1 | 0 | 1 | 0 | 0 | 0 | 0 | 1 | 1 | 0 | 1 | 0 |
| ē  | 0 | 0 | 1 | 0 | 1 | 0 | 0 | 0 | 0 | 1 | 1 | 0 |
| f  | 0 | 0 | 0 | 0 | 0 | 0 | 0 | 0 | 0 | 0 | 1 | 0 |
| f̄  | 1 | 0 | 1 | 0 | 1 | 0 | 1 | 1 | 1 | 1 | 1 | 1 |

FIGURE 15
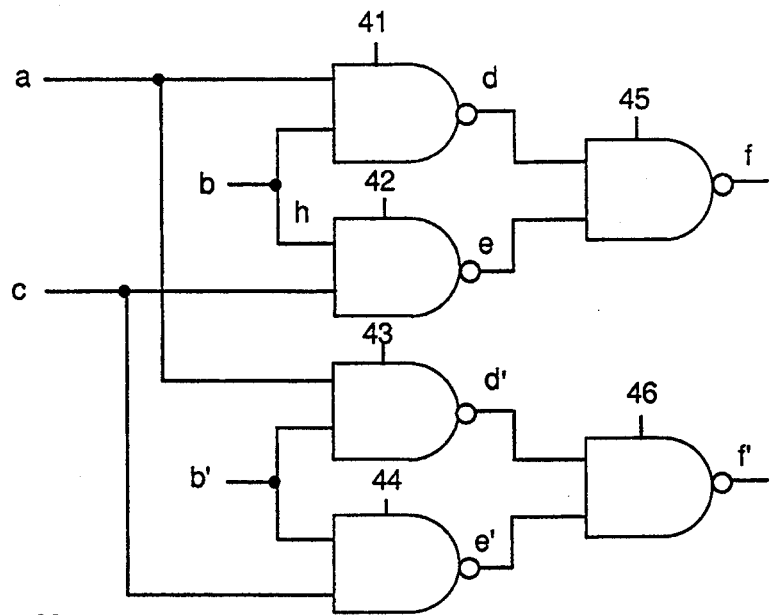
FIGURE 16
FIGURE 16
FIGURE 16
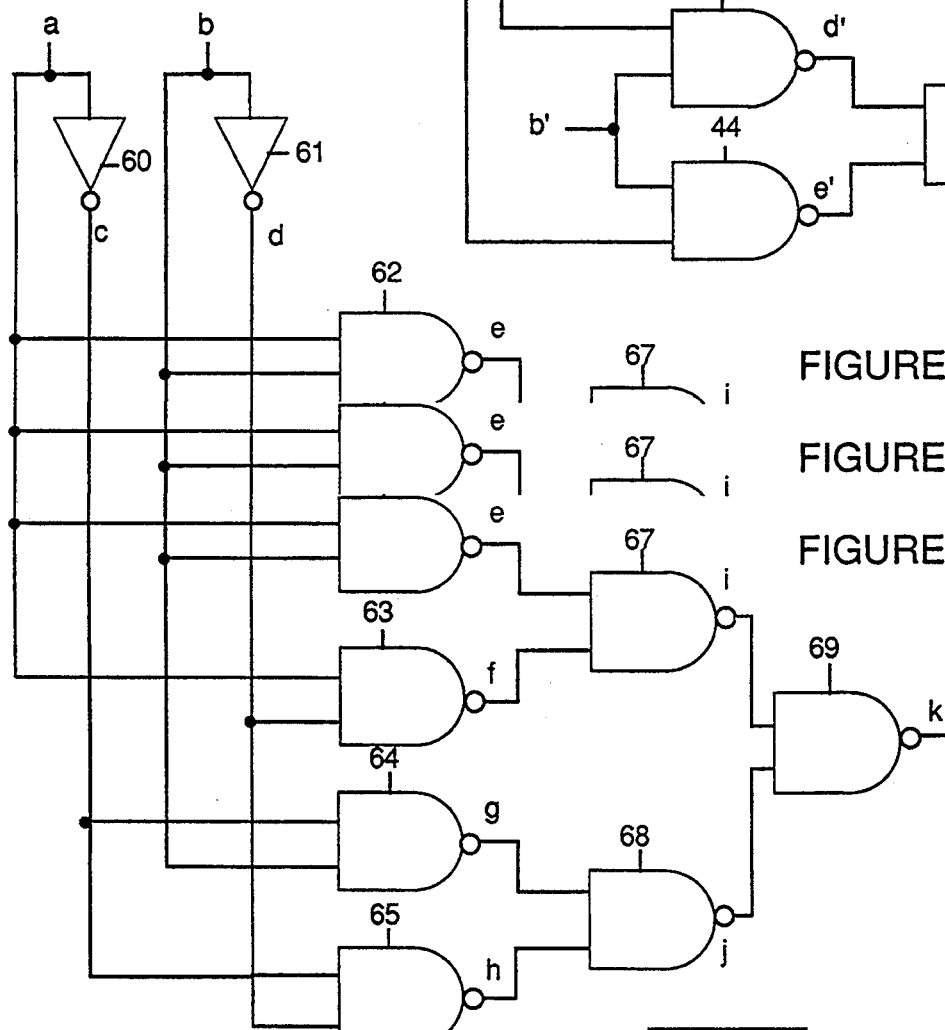
FIGURE 17
| Gate | Binary Terms |
|---|---|
| c | $ac = 0$, $\bar{a}\,\bar{c} = 0$ |
| d | $bd = 0$, $b\,d = 0$ |
| e | $\bar{a}\,\bar{e} = 0$, $bd = 0$ |
| f | $\bar{a}\,f = 0$, $df = 0$ |
| g | $b\,\bar{g} = 0$, $\bar{c}\,\bar{g} = 0$ |
| h | $\bar{c}\,h = 0$, $dh = 0$ |
| i | $\bar{e}\,i = 0$, $fi = 0$ |
| j | $\bar{g}\,j = 0$, $hj = 0$ |
| k | $i = 0$, $j = 0$ |

300

```
┌─────────────────────────────┐
│   GENERATING A SET          │
│                             │─ 301
│   OF TEST VECTORS           │
└─────────────────────────────┘
              │
┌─────────────────────────────┐
│   CONVERTING SET OF TEST    │
│   VECTORS TO SET OF         │─ 302
│   ELECTRICAL SIGNALS        │
└─────────────────────────────┘
              │
┌─────────────────────────────┐
│   APPLYING SET OF           │
│   ELECTRICAL SIGNALS        │─ 303
│   TO CIRCUIT UNDER TEST     │
└─────────────────────────────┘
```

FIGURE 25

TRANSITIVE CLOSURE BASED PROCESS FOR GENERATING TEST VECTORS FOR VLSI CIRCUIT

This is a continuation-in-part of application Ser. No. 07/717,081, filed Jun. 18, 1991, and now abandoned.

FIELD OF THE INVENTION

This invention relates to the testing of VLSI circuits and more particularly relates to the generation of a set of input vectors appropriate for efficiently testing a specific VLSI logic circuit for finding faults and excluding redundancies.

BACKGROUND OF THE INVENTION

As the number of components in VLSI circuitry has grown, the testing of such circuitry has become complex. The testing is complicated because it is impractical to probe internal nodes of the circuit. As a consequence, the usual manner of testing such circuits is to apply a set of input vectors to the input terminals of the circuit and for each input vector to observe the resulting output vector at the output terminals to ascertain whether the output vector observed corresponds to the output vector expected for the particular applied input vector. Each input vector typically is chosen to test for a particular one of the faults thought possibly to be found in the circuit. For complex circuits the number of possible faults tends to be large so that a large set of test vectors is needed. An important factor in this process is having a set of input vectors for use in the testing that will provide the maximum amount of relevant information in the shortest time of testing. Generally, the testing is done automatically by equipment designed to provide a prescribed set of input vectors sequentially to a sample circuit being tested to check the output vectors observed for conformance with the output vectors expected and to reject nonconforming samples.

Typically, choosing a set of test vectors is part of the design process of the integrated circuit. Normally, even before a phototype chip of a desired integrated circuit is built, there is developed an appropriate set of vectors for use in testing the eventual chip. This process involves establishing various faults that possibly might arise in the circuit and developing a set of vectors for testing for all or most of such possible faults.

Various techniques are in use for developing such sets of test vectors but there remains room for improvement. Typically previous techniques do not guarantee the identification of all logical consequences of a partial set of signal assignments. It is desirable to identify all such consequences so that a branch and bound method can effectively avoid signal assignments that will not lead to a test vector. Also previous techniques generally do not establish the complexity of determining the logical consequences, and it remains unclear if it is at all possible to determine all the consequences using reasonable amount of resources. Finally, these techniques tend not to be easily parallelizable.

BRIEF DESCRIPTION OF THE INVENTION

A feature of this invention is the use of transitive closure (TC) to help solve the test generation problem. Basically, transitive closure is the result of adding to a directed graph the new arcs that are implied by its original arcs. Essentially this involves adding arcs between a parent and all its desondants, i.e. children, children of the children, etc. Often the result is represented in matrix form, as is usually being done in the instant application. In particular, the invention involves a complete test generation algorithm based largely on use of TC. Parallel computation of TC has been extensively studied. Computing the TC is an important step in many parallel algorithms related to directed graphs. In a specific application of the principles of the invention, a composite circuit is first formed from versions of the circuit being tested both with and without the fault that a particular test is designed to detect and then an energy function based on the set of applicable constraints is derived for the composite circuit such that the set of test signal values that provides the minimum value to the energy function will correspond to a test vector for the fault. Such an energy function normally will include both binary and ternary potential terms and for the use of deriving a test vector for a given fault in accordance with TC it is generally necessary to reduce the ternary terms to binary terms. The composite circuit need not be prepared in hardware form but may instead be simulated by a computer.

A feature of the invention is the process by which ternary terms are reduced to binary terms. In particular, this process involves first finding a set of implications based on the binary relationships in the energy function, then obtaining the transitive closure of the set of implications, using the transitive closure to reach logical conclusions, such as the presence of contradictions, fixations, exclusions or identifications in the composite circuit, and finally using any conclusions reached to reduce ternary terms of the energy function to binary terms, to obtain an updated set of implications from the updated set of binary terms. This process is repeated until as many ternary terms as possible have been reduced to binary terms. At this point, if ternary terms remain, a selected node of the circuit is assigned a particular signal value, the implication graph of the circuit so fixed is derived, and the process for reducing ternary terms to binary terms is repeated for it until no ternary terms remain. In particular, as is discussed in such papers, the manner of deriving the energy function of a circuit merely involves adding algebraically the energy functions of the various logic gates forming the circuit. Each logic gate has an energy function (EF), as is described in the cited references. The energy functions of the various gates are readily derived from the principles set fourth therein and are as follows for the logic gate where a and b are input values and c is the output value and the Boolean algebra format is used.

AND circuit $EF = ab\bar{c} + c\bar{a} + \bar{b}c$

OR circuit $EF = a\bar{c} + b\bar{c} + \bar{a}\bar{b}c$

NAND circuit $EF = \bar{a}\bar{c} + \bar{b}\bar{c} + abc$

NOR circuit $EF = ac + bc + \bar{a}\bar{b}\bar{c}$

XOR circuit $EF = \bar{a}\bar{b}\bar{c} + \bar{a}b\bar{c} + a\bar{b}\bar{c} + abc$ XNOR circuit $EF = \bar{a}bc + a\bar{b}c + \bar{a}\bar{b}\bar{c} + ab\bar{c}$ NOT circuit $EF = ab + \bar{a}\bar{b}$.

If it is found that the assignment of the particular signal value results in a contradiction, the opposite value is assigned and the process repeated. Eventually this should lead to the elimination of all the ternary terms from the energy function. At this point, the set of signal values that reduce the energy function to a minimum are readily found and such signal values form the desired test vector for the original circuit. The transitive closure of the circuit is computed from the implication graph whose vertices are the true and complemented states of the signals expected to be found at the various internal nodes. A directed edge from x to ȳ also represented as (x, ȳ), in this graph represents the controlling influence of the true state of signal x on the false state of signal y. The variables x and y are associated with the same gate or signal net in the circuit. Since the implication graph includes only pairwise relations, it is a partial representation of the netlist. An implication graph as the term is used herein is a directed graph in which an edge directed from a vertex at a to a vertex at b indicates that the truth of a implies the truth of b. The transitive closure of the implication graph contains pairwise logical relationships among all signal-states. Every signal assumes only binary values: 0 or 1. When signal relationships describing fault activation and path sensitization are included in the implication graph, transitive closure determines signal relationships that can lead to logical contradictions, that directly identify many redundancies. Sensitization of physical and logical dominator, multiple backtrace, unique path sensitization, static and dynamic learning and other techniques that are useful in determining necessary signal assignments are implicit in the process. If signals thus determined satisfy the minimum of the energy function, we have a test. The energy function consists of pairwise and higher order signal relationships in the netlist. Otherwise, we enter the decision-making phase, fix an unassigned signal, and update the transitive closure to determine all logical consequences of this decision. The transitive closure computation is similar to matrix multiplication and hence, easily parallelizable. See for example a paper entitled "Constant Time Algorithms for the Transitive Closure and Some Related Graph Problems on Processor Arrays with reconfigurable Bus System", IEEE Trans. on Parallel and Distributed Systems, Volume 1, pp. 500–507, October 1990.

Basically, the process of the invention may be summarized as follows:

1. First derive the fault function circuit and combine it with the fault-free function circuit to form a composite circuit.

2. Derive the energy function of the composite circuit as a collection of binary and ternary potential terms based on the functional constraints that depend on both the function of the gates in the circuit and the structural constraints that depend on the specific interconnection topology of the gates, but are independent of the type of gates in the circuit. The various techniques for doing this have been described in papers entitled, "Toward Massively Parallel Automatic Test Generation" IEEE Transaction on Computer-Aided Design, Volume 9, pp. 981–994,September 1990, "Neural Net and Boolean Satisfiability Models of Logic Circuits", IEEE Design and Test of Computers, Volume 7, pp. 56–57, October 1990 and "Efficient Generation of Test Patterns Using Boolean Difference" in Proc of the IEEE International Test Conference, pp. 795–801, August 1989.

3. Determine in turn the implication graph and the TC of the constraints expressible as binary terms and identify the logical conclusions such as contradictions, identifications, fixations and exclusions. If a contradiction is detected, the fault is redundant. If signal values, thus determined, satisfy the whole energy function of composite circuit, we have a test. Otherwise, one seeks to use the partial set of signal values determined thus far to reduce some of the ternary terms to binary terms. Use these terms to update the implication graph and to recompute the TC to identify further logical conclusions. Continue this process until no ternary relation reduces to a binary relation.

4. Make a choice on an unassigned decision variable. This may cause some of the ternary terms to become binary terms.

5. Use the new binary terms to update the implication graph, compute a new TC and derive additional logical conclusion and if there is a contradiction, backtrack to Step 4 and make the alternative choice of the unassigned decision variable. Again, if the signal assignments provide a minimum in the energy function of composite circuit, we have a test. Otherwise, add ternary terms that have been reduced to binary terms due to current set of signal assignments to the TC and go to Step 3.

BRIEF DESCRIPTION OF THE DRAWING

FIG. 4 is a circuit including a fault for which a test vector is to be derived.

FIG. 5 is a modified version of the circuit of FIG. 4. It is the composite circuit for the given fault and it will be useful in deriving the test vector.

FIG. 6 is the implication graph of the circuit of FIG. 5 and FIG. 7 is the transitive closure of the implication graph of FIG. 6.

FIGS 8, 9 and 10 are another circuit example, its implication graph and its transitive closure, respectively.

FIG. 11 is the implication graph of a modified version of the circuit of FIG. 8

FIG. 15 is a modification of the circuit shown in FIG. 8.

FIG. 16 is a circuit example with a redundant fault and

FIG. 17 is a table of binary terms obtained for a special case of the circuit in FIG. 16.

FIG. 25 is a flow diagram of the testing process of the invention.

DETAILED DESCRIPTION OF THE DRAWING

It will be helpful to begin with a review of the basic procedure typically used for developing sets of test vectors.

Figure 1:
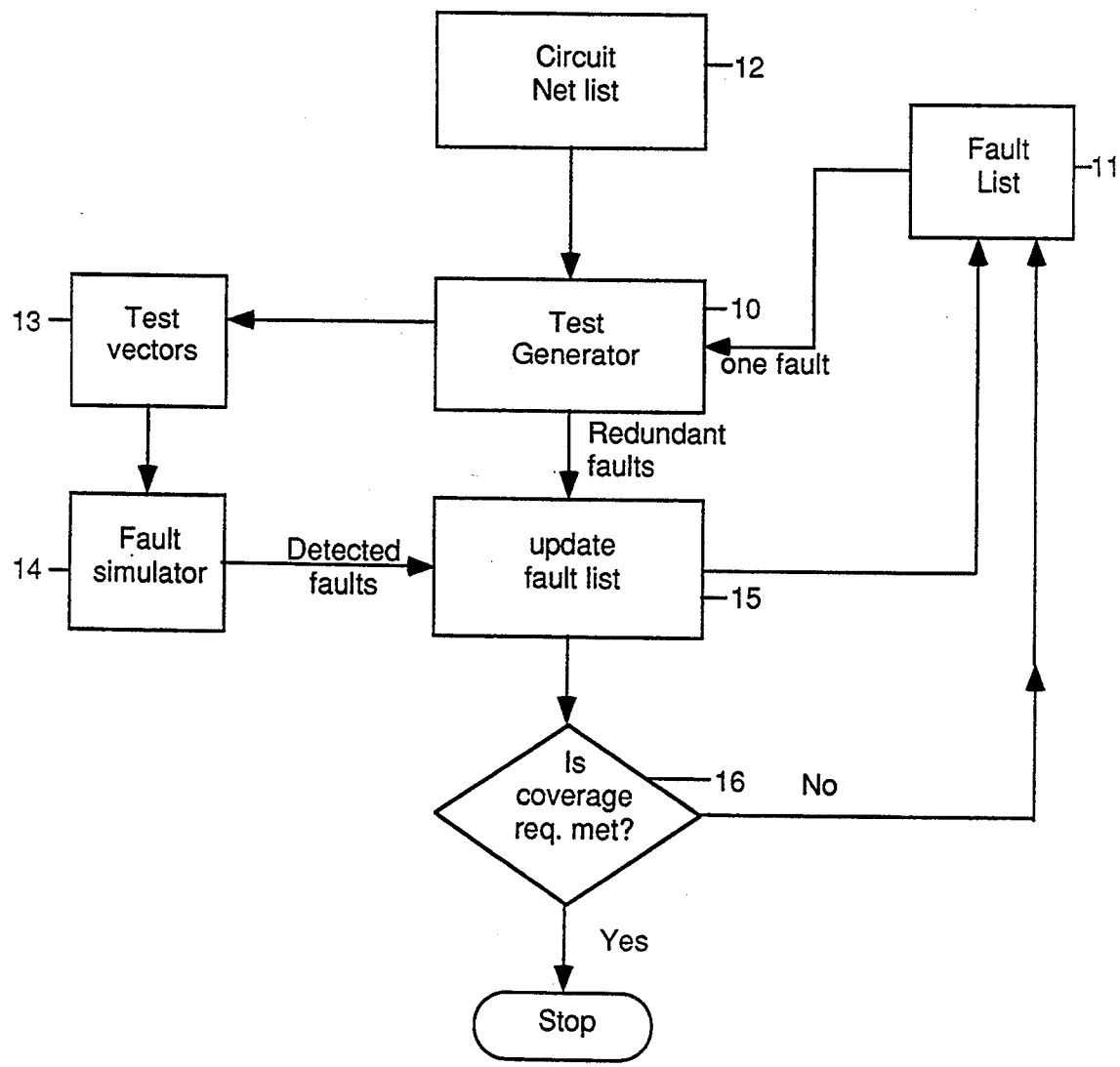
FIG. 1 is a hybrid diagram of the basic procedure presently in wide use for developing a set of vectors to test for a list of the most likely faults expected in a VLSI circuit.

In FIG. 1, there is shown a hybrid prior art diagram that illustrates the overall procedure used for developing a set of vectors to test a VLSI circuit for each of the faults on a list of possible faults that might occur in the circuit.

To the test generator 10 there is supplied from a fault list 11 that may be a file or data set in which the possible faults have been stored, a particular fault to be tested. Also supplied to the test generator 10 are the parameters of the circuit being tested in the form of a circuit netlist 12. For a given fault and circuit netlist, the test generator provides a specific vector for use in testing for the particular fault. The test vector 13 developed generally is also supplied to a fault simulator 14 which is designed to recognize the suitability of the specific test vector for testing for other faults in the fault list 11. Such other possible faults are used in the means 15 for updating the fault list, and deleting such other faults from the fault list 11 so that a separate vector for any such other fault need not be generated. If the fault is a redundant fault, (a fault for which no test vector is possible,) such fault is also removed from the fault list by using the update fault list means 15.

Moreover, as the updated fault list means 15 is updated, information of the faults remaining on the list 11 is checked to ascertain by coverage checking means 16 whether the desired coverage of possible faults has been reached and, when the answer is yes, the process is stopped. Coverage checking determines if the set of test vectors detect a pre-specified fraction of the likely faults in the chip.

In this basic system or process, the present invention is centered on the test generation step or component.

Figure 2:
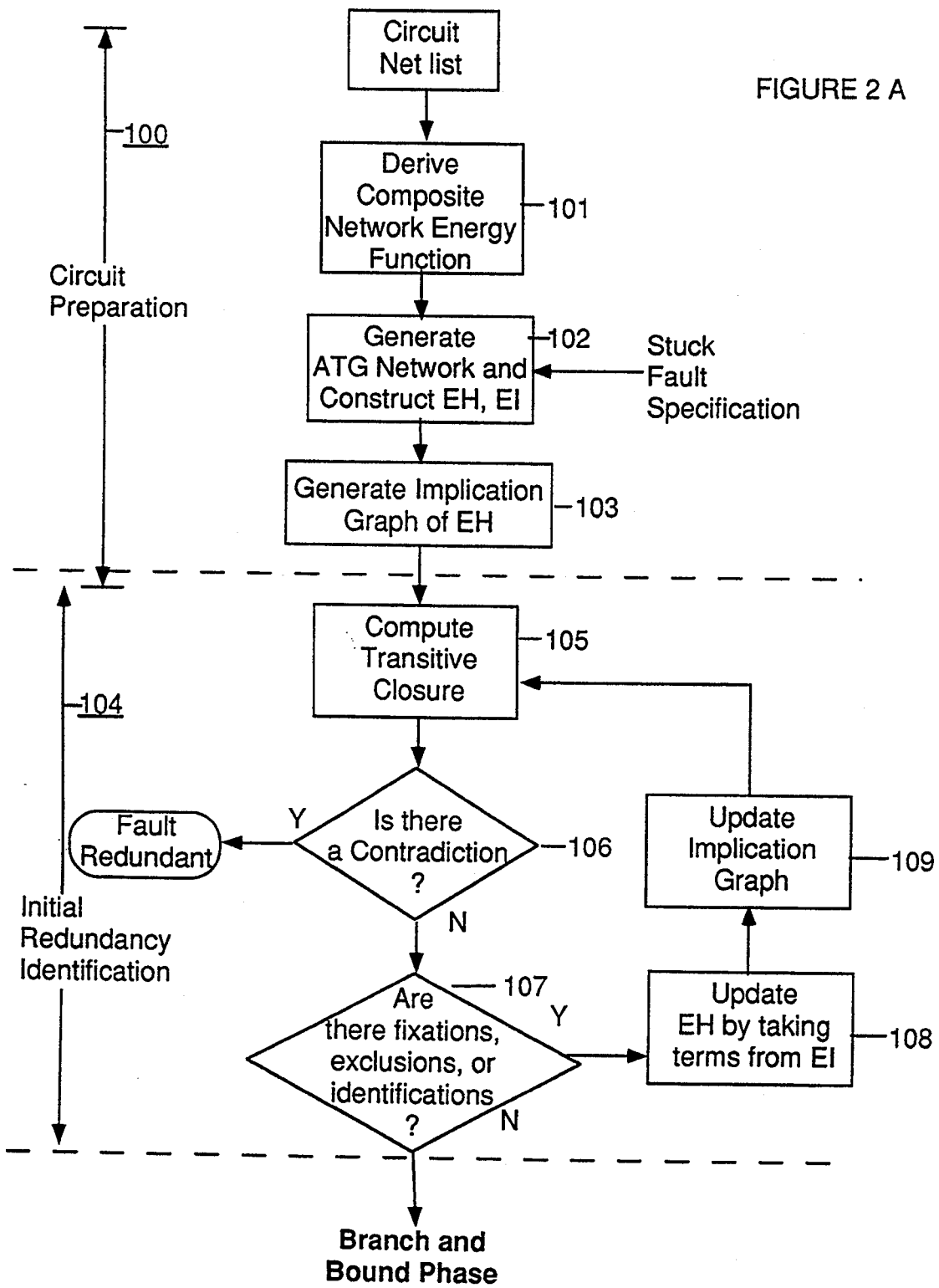
FIGS. 2A and 2B combine to form FIG. 3 which represents a flow diagram of an illustrative embodiment of the process of the present invention used for generating a vector for testing for a particular fault.
Figure 2:
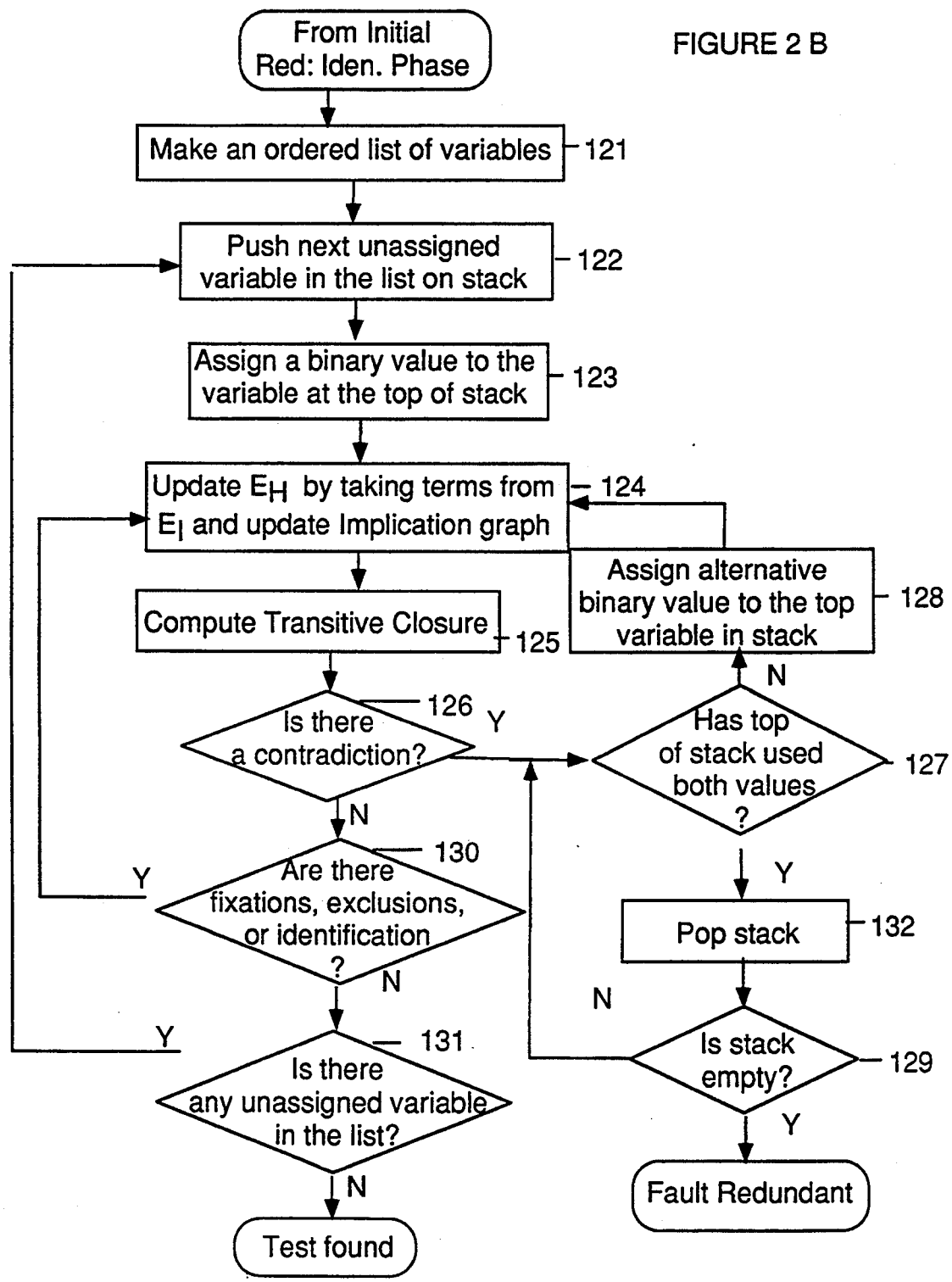

FIG. 2A and 2B may be viewed alternatively as a flow chart of the basic steps for accomplishing the test generation or as a combination of means for accomplishing the test generation.

The process of generating a suitable set of test vectors in accordance with an illustrative embodiment of the invention begins with a circuit preparation stage 100.

This stage involves a series of steps which culminate in the generation of an implication graph specific for the circuit under test and for a particular fault to be checked. A variety of techniques are believed available for this stage, but the particular one, described below, is favored when the circuit complexity warrants.

In particular, our illustrative process begins with step 101 which involves representing the digital circuit to be tested formed by combining the fault-free and fault present circuit functions, as a composite network in which the circuit function can be coded in the firing thresholds of neurons and the weights in interconnection links, as is described in a paper entitled "Toward Massively Parallel Automatic Test Generation," IEEE Trans. on Computer-Aided Design, Vol. 9, No. 9, pp. 981–994 September 1990. In the end, there is derived a neural network energy function from which there can be generated an automatic test generation network as indicated by step 103 in the manner described in a paper entitled "Automatic Test Generation Using Quadratic 0–1 Programming" presented as a talk on Jun. 24, 1990 at the 27th ACM/IEEE Design Automation Conference. In both of these last-two mentioned publications, we were included as two of the three authors. In the methodology of these two publications, the relationship between the input and output signal states of a logic gate is expressed through an energy function such that the minimum-energy states correspond to the gate's logic function. This energy function E is split into two sub-functions, a homogeneous posiform $E_H$ and an inhomogeneous posiform $E_I$. In the art, a posiform (positive pseudo-Boolean form) is any sum of monomials with positive coefficients. A homogeneous posiform is one without a constant term and so one with only binary terms. An inhomogeneous posiform is one with a constant term and so one with only ternary potential terms. The desired minimum is the sum of the minions of the two sub-functions, each having a minimum value of 0. As is described in tile last-mentioned paper, the homogeneous posiform may have exponentially many minimizing points. To aid in finding a minimum, the homogeneous posiform is used first alone to derive directly an implication graph. The remaining inhomogeneous posiform is treated as containing auxiliary information to be used piecemeal later in updating the initial implication graph as indicated by step 103. This two stage process makes finding the desired minimum considerably easier than if the entire body of energy functions were considered together.

As has been indicated above, the step 105 of computing the transitive closure of a directed graph is a well known process and is discussed in a book entitled "Introduction to Algorithms", McGraw Hill 1990and also in U.S. Pat. No. 4,930,072, which issued on May 29, 1990. As is discussed in such references, the transitive closure of a graph is a new graph in which there have been added arcs between each pair of vertices between which there already existed a path involving multiple arcs. However, now the transitive closure is generally derived by a suitable computer program, as is discussed in a paper entitled "Computing Dominators in Parallel" Inform Process Lett. 24:217–221 (1987). In our specific embodiment, we use a modification of this process as will be discussed with reference to FIGS. 17–19. An important application of transitive closure is in deriving all logical conclusions implied by a set of binary relations.

From the TC, there is determined whether there is a contradiction as indicated by step 106. If there is, the fault is redundant and this fault is deleted from the fault list as previously described. If there is no contradiction detected by TC, we examine as step 107 whether there are any fixations, identifications and exclusions. If the answer is yes, this information is used as indicated by step 108, to update the homogeneous posiform $E_H$ by taking terms from $E_I$ and recomputing the transitive closure as indicated by step 105 and the process is repeated. If there are no fixations, exclusions and identifications, we use the final branch and bound phase of the test generation (FIG. 2B).

As indicated in step 121 from the information received from the initial redundancy identification phase, there is prepared an ordered list of the variables involved. Then, as indicated by step 122, the next unassigned variable on the ordered list is pushed on to a stack and as indicated by step 123, a value (0 or 1) is assigned to the variable at the top of the stack. As indicated by step 124, this value is used to update $E_H$ and its current implication graph, and then to recompute the transitive closure as indicated by step 125. Then, as step 126, there is checked the presence of a contradiction. If a contradiction is present, one asks as step 127 whether the top variable on the stack has been tested both with an assigned 0 and a 1. If the answer is no, as step 128 there is a value assigned to the top variable in the stack and the reassigned variable is supplied to step 124 and step 125. Thereafter, in step 126 again there is Checked for a contradiction. If the answer is again yes, so that now the answer to step 127 is also yes, the literal is popped off the stack, as indicated by step 132.

As step 129 there is then checked whether the stack is empty. If the answer is yes, the fault being tested is redundant. If the answer is no, it is returned for checking to step 127.

If the answer to step 126 had been a no, the transitive closure would then have been examined for exclusions, fixations and identifications, as indicated by step 130. If any were present, a return is made to step 124 for updating $E_H$ and the implication graph, and then continuing as before.

If the answer to step 130 was no, there is then checked in step 131 as to whether there remain any unassigned variables on the list. If the answer is no, it is an indication that a good test was found. If the answer is yes, and there remain variables in the list, one returns to step 122 and pushes the next unassigned variable on the list to the top of the stack and the process repeated until ultimately all variables on the list have been cycled through.

We will now illustrate our method by a simple example. Consider the circuit shown in FIG. 4. This circuit comprises the NAND gate 50 having inputs a and b and output c and NAND gate 52 with inputs b and c and output d. We will derive a test for "a stuck-at- zero" (s−a−0) fault 54 on the c output, of NAND 50.

First, there is prepared a composite circuit as shown in FIG. 5. Generally, this circuit need not be prepared in hardware but is only simulated for purposes of analysis, typically by a computer. This composite circuit is the equivalent of combining in parallel two versions of the circuit shown in FIG. 4, one with the stuck-at-zero fault, and another with the stuck-at-zero fault absent.

As shown, the composite circuit includes the NAND circuit 50, which is supplied with inputs a and b, and NAND circuits 52 and 55, both of which have b as one input. NAND circuit 52 has its other input connected to output c of the NAND circuit 50, which is free of the fault, and NAND circuit 55 has as its other input c', which is stuck-at-zero. To detect the case when the outputs of the two NAND circuits 52 and 55 differ, the case that the particular values of a and b form a vector that is a test for the fault, the two outputs are combined after one is inverted in inverter 56.

This detection technique is known to workers in the art and basically depends on the principle that, if one has two circuits which differ in only one respect and one can find a particular input vector that results in different outputs for the two circuits, that particular input vector is a test for the presence of that one difference.

(1) Derivation of functional constraints. These constraints depend upon the function of gates used in the circuit.

(2) Derivation of structural constraints. These constraints depend on the specific interconnection topology of gates and are independent of the gate types used in the circuit.

Functional constraints:

Signals that lie on a path from the fault site to a primary output may assume different values in the fault-free and faulty circuits. Therefore, additional binary variables are assigned to these signals. In our example, signals c and d lie on the path from the fault site to the primary output and we assign two binary variables c' and d', respectively. Conceptually, this can be visualized as construction of a faulty circuit copy, by the addition of NAND 55, as shown in FIG. 5. The energy function for the modified circuit is given by the summation of the energy functions for the gates c, d and d' (we address a gate by the name of its output signal). Furthermore, signals c and c' are constrained to assume the logic values 1 and 0, respectively. All the functional constraints can be determined from the netlist of the circuit in time complexity that is linear in the number of signals.

Structural constraints:

We assign a binary variable, called the path variable, $s_x$ to every signal x that lies on a path from the fault site to the primary output. This variable assumes the logic value 1 only when the fault on x is observable at the primary output. In our example, signals c and d are assigned the binary variables $s_c$ and $s_d$. There are two types of structural constraints. Both can be derived from the netlist of the circuit in time complexity that is linear in the number of signals. First, an input fault on a gate is observable only if the gate output fault is observable. Note that the converse need not be true. In our example, if $s_c=1$, then $s_d$ must assume the value 1. This constraint is expressed as follows: $s_c \bar{S}_d = 0$. For a stem fault to be observable, the fault must propagate through one or more of the branches. This case is not applicable in the present example. Second, if the path variable associated with signal x is true, then signal x must assume different values in the fault-free and faulty circuits. If we denote the faulty circuit value as x', this constraint is expressed as an energy function as follows: $s_x(xx' + \bar{x}\bar{x}) = 0$. Notice that this condition cannot be expressed as binary relations. For the fault to be observable, the path variables associated with the fault site and the primary output are constrained to be 1. Therefore, in our example, $s_c = s_d = 1$.

In summary, the functional constraints are: $\overline{ac} + \bar{b}\bar{c} + abc = 0, \overline{bd} + \overline{cd} + bcd = 0$ and $\overline{bd'} + \bar{c}'\bar{d}' + bc'd' = 0$. The structural constraints are: $s_c\bar{s}_d = s_c(cc' + \overline{cc'}) = s_d(dd' + \overline{dd'}) = 0$.

The summation of the functional and structural constraints is the energy function for the circuit with a fault. The energy function of a digital circuit is the summation of the energy functions for all gates. Test generation procedure consists of the following steps:

1. Derive functional and structural constraints for the fault.

2. Determine the TC of constraints expressible in an implication graph as binary relations and identify contradictions, identifications, fixations and exclusions (derivation of logical conclusions from the TC is described later). If a contradiction is detected, the fault is redundant. If signal values, thus determined, satisfy the energy function, we have a test. Otherwise, a partial set of signal values determined thus far may reduce some of the ternary terms to binary terms since a ternary term becomes a binary term when any one of its variables assumes a known value. We include these terms in the TC and recompute logical conclusions. We continue this process until no ternary term reduces to a binary term.

3. Make a choice on an unassigned decision variable. This may cause some of the ternary terms to become binary terms.

4. Include the new binary terms in the TC and observe any contradictions, identifications, fixations and exclusions. If there is a contradiction, we backtrack to Step 3 and make an alternative choice. If the signal assignments satisfy the energy function, we have a test and we stop. Otherwise, ternary terms that have been reduced to binary terms due to current set of signal assignments are added to the transitive closure. We continue this process until no ternary term reduces to a binary term, we then go to Step 3.

Since we are deriving a test for the s−a−0 (stuck-at-zero) fault on Signal c, $c=1c'=0$, $s_c=s_d=1$ and our constraint set reduces to: $ab=0, \overline{bd}+db=0, \overline{d}+\overline{bd}=0$ and $dd'+\overline{dd}=0$. All the terms can be expressed as binary terms.

The implication graph resulting is shown in FIG. 6.

It contains vertices for variables and their complements. Here, the vertex set is $\{a,b,d,d',\overline{a},\overline{b},\overline{d},\overline{d}\}$. The constraint $ab=0$ is expressible as a pair of binary relations $a \rightarrow \overline{b}$ and $b \rightarrow \overline{a}$ that are represented as arcs $(a,\overline{b})$ and $(b,\overline{a})$, respectively. Arcs corresponding to the other terms are similarly derived.

The transitive closure in matrix form of the implication graph is shown in FIG. 7. This can be computed using standard graph-theoretic techniques or the preferred technique we describe in FIG. 19–21. The following types of logical conclusions are implied by the binary terms and they can all be determined from the TC as follows:

1. Contradiction: A variable x must simultaneously assume 0 and 1 values when the TC consists of both arcs $(x,\overline{x})$ and $(\overline{x}, x)$. If this situation occurs before the search process begins or after the search space has been implicitly exhausted, the fault is redundant. If a contradiction occurs during the search process, we must backtrack to the previous choice.

2. Fixation: A variable x can be fixed to the value 0 if the TC consists of the arc $(x,\overline{x})$ but not the arc $(\overline{x},x)$. Similarly, if the TC consists of the arc $(\overline{x},x)$ but not $(x,\overline{x})$, variable x can be fixed at 1.

Figure 18:
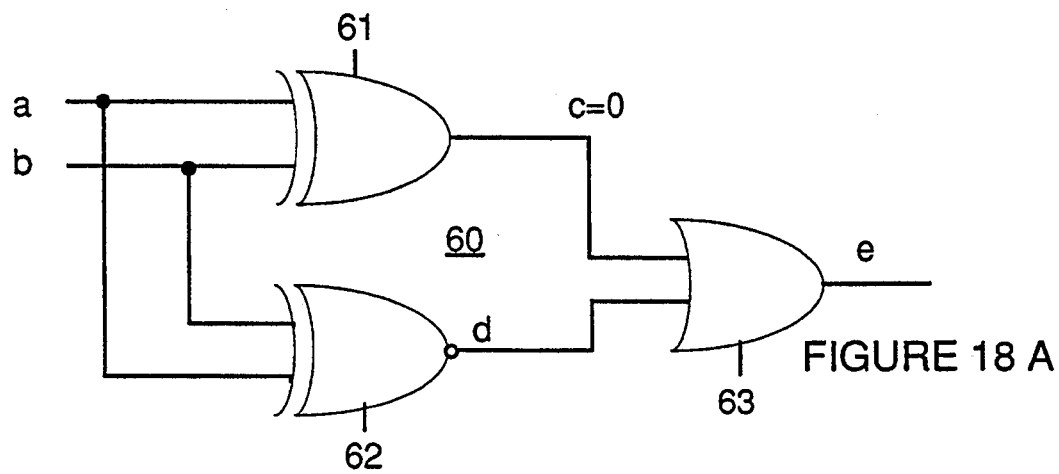
FIGS. 18A, 18B and 18C will be used in explaining the concepts of identification and fixation.
Figure 18:
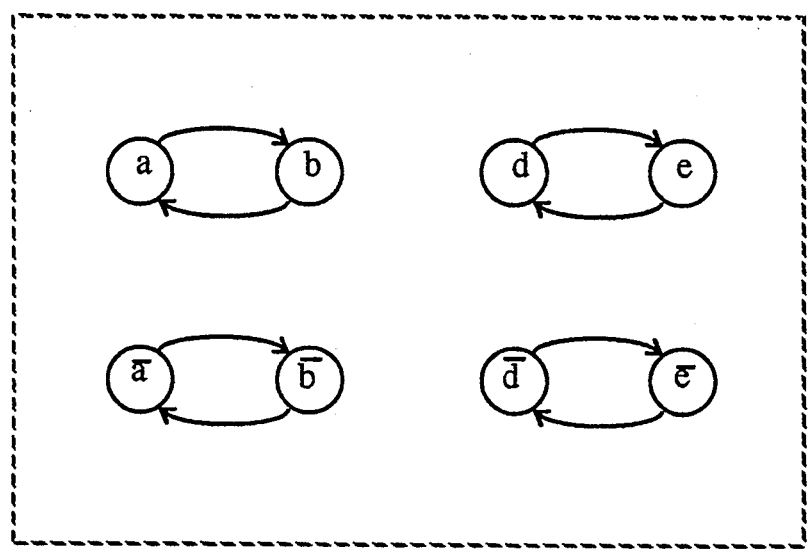
Figure 18:
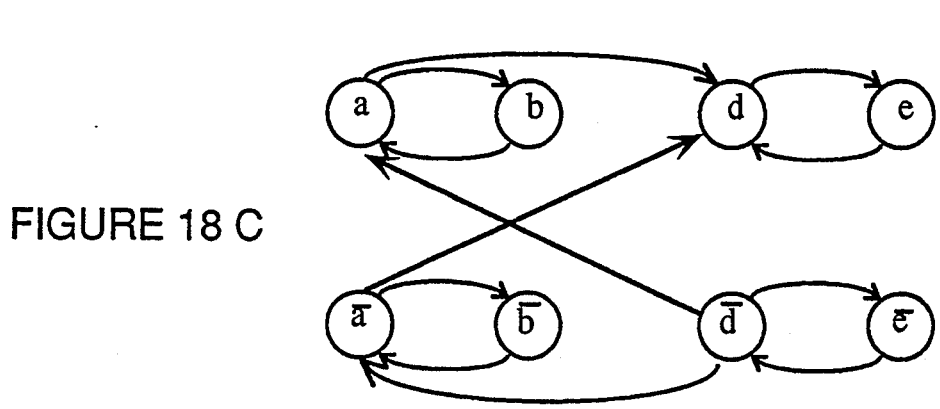

3. Identification: Certain pairs of literals must assume the same value if the TC consists of the arcs (x,y) and (y,x). FIG. 18 shows a circuit 60 useful as an example of an identification and how this property can be used. It comprises the exclusive OR gate 61 with inputs a and b and output c, the exclusive NOR circuit 62 with inputs a and b and output d and the OR gate 63 with inputs c and d and output e and c set to zero.

FIG. 18B is an implication graph that only a partial representation of the circuit. The rest of the circuit information is included in inhomogeneous terms that do not lend themselves to inclusion in implication graph since they are not binary relation. The inhomogeneous terms are $d(a\overline{b}+\overline{a}b)$ and $d(ab+\overline{ab})$. From the implication graph, it follows that $a=b$, and $e=d$ so that the second of the two terms unincluded reduces to $da+d\overline{a}$ and these terms can be added to the implication graph as shown in FIG. 18C. This graph leads to the fixation $\overline{e} \rightarrow e$, which requires that e equal one.

4. Exclusion This is a global dependency where certain pairs of variables cannot assume a certain combination of values. If the transitive closure consists of the arcs (x,y) and $(\overline{y},\overline{x})$ and no other arcs between the variables x and y, then the combination $x=1$ and $y=0$ is excluded. This is because these arcs imply that $x\overline{y}=0$ and the above combination does not satisfy this relationship.

Figure 22:
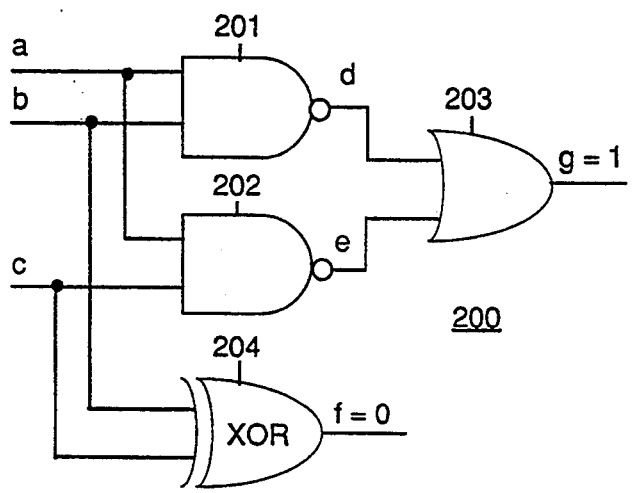
FIGS. 22, 23, and 24 are, respectively, a circuit example of an exclusion logical conclusion, its implication graph, and the updated implication graph after the inclusion of a functional constraint.
Figure 23:
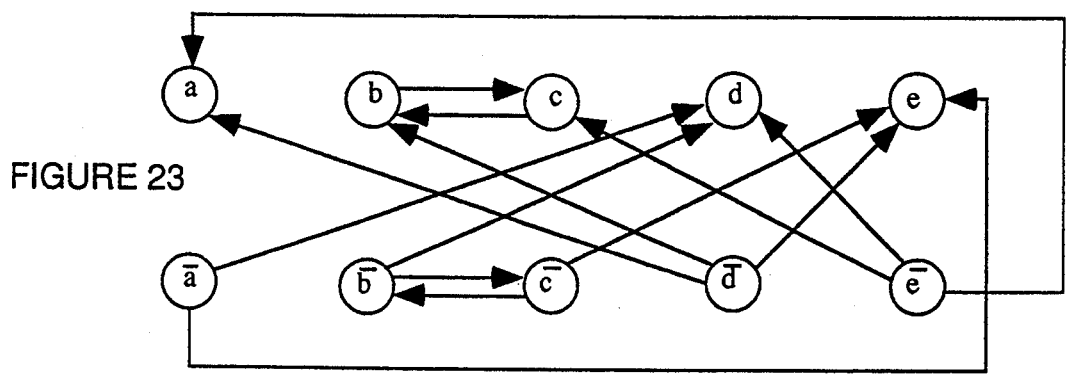

As an example, consider the portion of a circuit 200 shown in FIG. 22. This circuit includes the NAND gate 20 with inputs a and b and output d and the NAND gate 202 with inputs a and c and output e. Outputs d and e are inputs to the OR gate 203 which has output g. Input b and c are inputs of the exclusive OR gate 204 whose output is f. Suppose that during test generation for some fault, signals g and f have been assigned the values 1 and 0, respectively, as indicated. Due to these signal assignments, the functional constraints of gates g and f simplify to $\overline{de}=0$ and $bc+\overline{bc}=0$. The functional constraints for gates d and e are $\overline{d}+\overline{bd}+abd=0$ and $\overline{ae}=-ce+ace=0$. The implication graph for the binary terms in these functional constraints is shown in FIG. 23. If we compute the transitive closure of the implication graph, we observe that signals b and c form an identification or they must assume the same value. Furthermore, the transitive closure consists of the arcs $(\overline{d},e)$ and $(\overline{e},d)$ that imply the constraint $\overline{de}=0$. Therefore, $d+e=1$. Using the identification of signals b and c and the fact that $d+e=1$, the ternary terms $abd=0$ and $ace=0$ can be simplified to $ab=0$.

Figure 24:
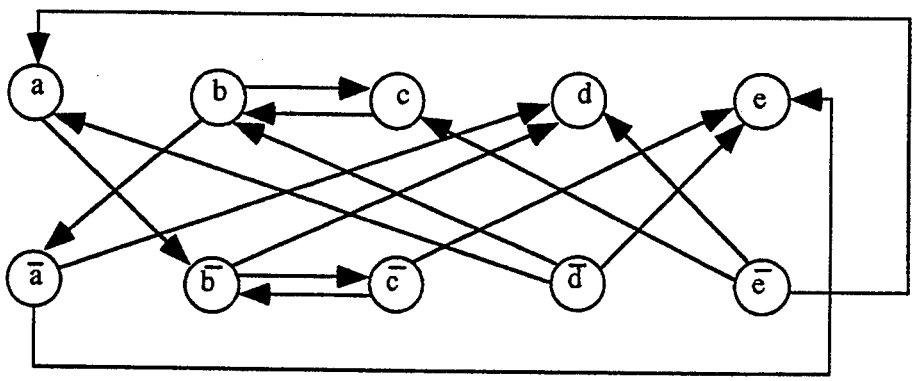

We include the constraint $ab=0$ in the implication graph. The updated implication graph is shown in FIG. 24. If we compute the transitive closure of the updated implication graph, we observe that signals d and e are fixed to the value 1.

In general, if the transitive closure consists of the arcs (x,y) and $(\overline{y},\overline{x})$ but no other arcs between variables $x,\overline{x},y$ and $\overline{y}$, the only constraint between variables x and x is $x\overline{y}=0$. Therefore, x and y can assume any combination of values except the combination as $x=1$ and $y=0$. This implies that $(\overline{x}+y)=1$ and the ternary terms can be further simplified.

Continuing the test generation process for the s−a−0 fault on signal c in FIG. 4, the transitive closure shown in FIG. 7 contains the arc $(a,\overline{a})$, and therefore we have a fixation $a=0$. Similarly $b=d'=1$ and $d=0$. Since all primary input signals have been determined, there is no need for a search phase. The vector $a=0$, $b=1$ is a test for the fault $cs-a-0$ for the circuit shown in FIG. 4.

The techniques of implication, justification, static learning, dynamic learning and sensitization of dominators are implicit in the TC method. Also, as we will explain, logical dominators are implicitly sensitized. Furthermore, it is possible to detect difficult redundancies that may not be detectable using other techniques.

Implicit Implication and Justification

Consider the circuit shown in FIG. 8. This comprises the NAND circuits 30, 31 and 32. NAND circuit 30 has inputs a and b and output d, NAND circuit 31 has inputs b and c and output e, and NAND 32 has inputs d and e and output f. The energy function for this circuit, which is the summation of energy functions for gates d, e and f, consists of the following binary terms: $\overline{ad},\overline{bd},\overline{be},\overline{ce},\overline{df}$ and $\overline{ef}$.

The binary terms are represented in the IG shown in FIG. 9. This graph also happens to be its own TC. The adjacency matrix of the TC is shown in FIG. 10.

Suppose $d=0$. Forward implication will result in $f=1$ and justification will result in $a=b=1$. This is implicitly determined in the TC method:

1. Include the relation $d=0$ into the IG of FIG. 9 by adding the arc $(d,\overline{d})$. The updated IG is shown in FIG. 11.

Figures 12, 13, 14:
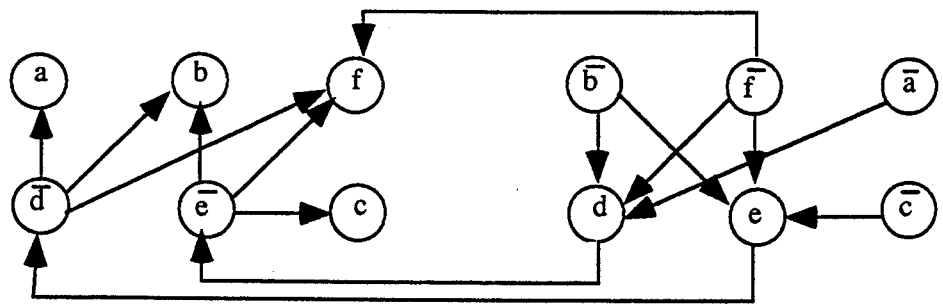
FIG. 12 is its transitive closure.
FIG. 13 is the implication graph of the circuit of FIG. 8 with an assigned output and FIG. 14 is its transitive closure.

2. Construct the TC of the updated implication graph. The updated TC in matrix form is shown in FIG. 12. We can directly derive the updated transitive closure from the TC shown in FIG. 10 as follows. The addition of the arc $(d,\overline{d})$ will allow all ancestors of d to reach all descendants of $\overline{d}$. The ancestors of d, i.e., vertices $\overline{a},\overline{b}$ and $\overline{f}$, are the vertices with a 1 in column d in FIG. 10 and the descendants of $\bar{d}$, i.e., vertices a, b and f, are the vertices with a 1 in row /. For example, vertex $\bar{b}$(an ancestor of d), that in FIG. 10 could only reach d and e, can now also reach vertices a, b, $\bar{d}$ and f (see FIG. 12).

3. Derive logical conclusions from the updated TC of FIG. 12. In it, there is an arc ($\bar{a}$, a) but there is no arc (a, $\bar{a}$). Thus, the fixation a=1 is the only value that can satisfy the arc ($\bar{a}$, a) (note that this arc can only result from the relation ($\bar{a}$=0). Similarly, we can conclude that b=f=1.

Transitive Closure does more than Implication and Justification

Consider the case when signal f in the circuit of FIG. 8 is assigned the value 1. This results in the addition of the arc ($\bar{f}$, f) to the IG leading to FIG. 13. The transitive closure method will fix signal b to logic value 1, as explained below. It is important to note that, given f=1, conventional implication and justification procedures will not be able to conclude that signal b should be fixed at 1.

If f=1, the three-variable term def in the false function of the gate f reduces to de. Inclusion of the relations $\bar{f}$=0 and de=0 will result in the addition of the following arcs to the IG of FIG. 13: ($\bar{f}$,f), (d,$\bar{e}$) and (e,$\bar{d}$). The updated IG is shown in FIG. 13 and the corresponding TC adjacency matrix is given in FIG. 14. As explained earlier, we can also construct the updated TC by incrementally changing the TC shown in FIG. 10.

Notice that the updated TC (FIG. 14) has a 1 in row $\bar{b}$ and column b. Thus, $\bar{b}$ implies b. But b does not imply $\bar{b}$. The arc ($\bar{b}$, b), therefore, indicates the relation $\bar{b}$=0. Hence, b must be fixed at 1 as a consequence of originally fixing f=1.

Implicit Sensitization of Physical and Logical Dominators

Dominators are gates through which the fault must propagate in order to be observable. We refer to such gates as physical dominators. As an example, consider the fault b s—a—0 in the circuit of FIG. 8. It is easy to see that the fault must propagate through gate f to be observable at the output of the circuit and thus f is identified as a physical dominator. When signal a is assigned the value 0, the fault must propagate through gate e to reach an output. Gate e is now a logical dominator.

The TC method implicitly identifies and sensitizes many physical and logical dominators. We illustrate these features by an example. The physical dominators of fault b s—a—0 are determined purely from the structural constraints, as expressed by these path variables: $s_a\bar{s}_d$=0, $s_c\bar{s}_e$=0, $s_d\bar{s}_f$=0, $s_e\bar{s}_f$=0 and $s_b\bar{s}_d\bar{s}_e$=0, The last constraint ensures that the stem fault on b propagates to either signal d or e or both in order to be observable at the primary output. Initially, $s_b$ is set to 1 since we assume that the fault on stem b is observable. This will reduce the ternary term $s_b\bar{s}_d\bar{s}_e$=0 to the binary relation $\bar{s}_d\bar{s}_e$=0. It can easily be verified that the TC of these binary relations fixes $s_f$ to 1. Therefore, gate f is a dominator. Note that f will be identified as a dominator of the fault even if this circuit was embedded in a larger circuit.

As an example of identification and sensitization of logical dominators, consider the case when signal a is set to logic value 0. Since the fault on stem b cannot propagate to gate d, gate e becomes the logical dominator. Furthermore, signal c must be set to 1 to sensitize the logical dominator e. The identification of e as the logical dominator and the assignment c=1 is implicitly determined by the TC method, even in the case when the circuit is part of a larger circuit and there are multiple paths from signal f to the primary output. To see this, we construct the energy function for the circuit with fault. Conceptually, we can visualize the circuit with fault as the modified circuit shown in FIG. 15. The circuit shown in FIG. 15 includes the NAND gates 41 through 46 and the various inputs and outputs shown, with fault b stuck at zero where b is an input to NANDs 41 and 42. By including the functional and structural constraints in the energy function of the faulty circuit, by computing implication graph and by computing the TC, we see that $s_e$=1 and c=1.

Redundancy Identification

Consider the circuit shown in FIG. 16 with a fault k stuck-at-one. This circuit comprises the two inverters 60 and 61 having inputs a and b and outputs c and d, respectively, and NAND gates 62, 63, 64 and 65, of which NAND 62 has inputs a and b and output e, NAND 63 has inputs a and d and output f, NAND 64 has inputs c and b and output g and NAND 65 has inputs c and d and output h. It further includes NAND 67 with inputs e and f and output i and NAND 68 with inputs g and h and output j. It finally includes NAND 69 with inputs i and j and output k. By simulating the circuit for all possible combinations of a and b, it can be verified that the fault k s—a—1 is indeed redundant. Since the fault is on the primary output, we simply have to justify the value 0 on signal k. The binary terms obtained from the energy function of the circuit are listed in FIG. 17. The energy function for gate k is $\bar{i}+\bar{j}$ since k=0. Therefore, gate k contributes the terms $\bar{i}$=0 and $\bar{j}$=0 to the energy function of the entire circuit. Binary terms contributed by other gates can be similarly derived.

If we represent these terms as an IG and con, pure the TC, both arcs (a,$\bar{a}$) and ($\bar{a}$,a) will be present in the TC. This indicates a contradiction and, therefore, no assignment of signal values will satisfy the energy function for the circuit with k=0. We conclude that the fault is redundant.

As a separate feature of the invention, we have developed a novel procedure for computing the transitive closure indicated as step 105 in FIG. 2A that may be preferable to known procedures. The basic steps of this procedure are shown in the flow diagram of FIG. 19.

Figure 19:
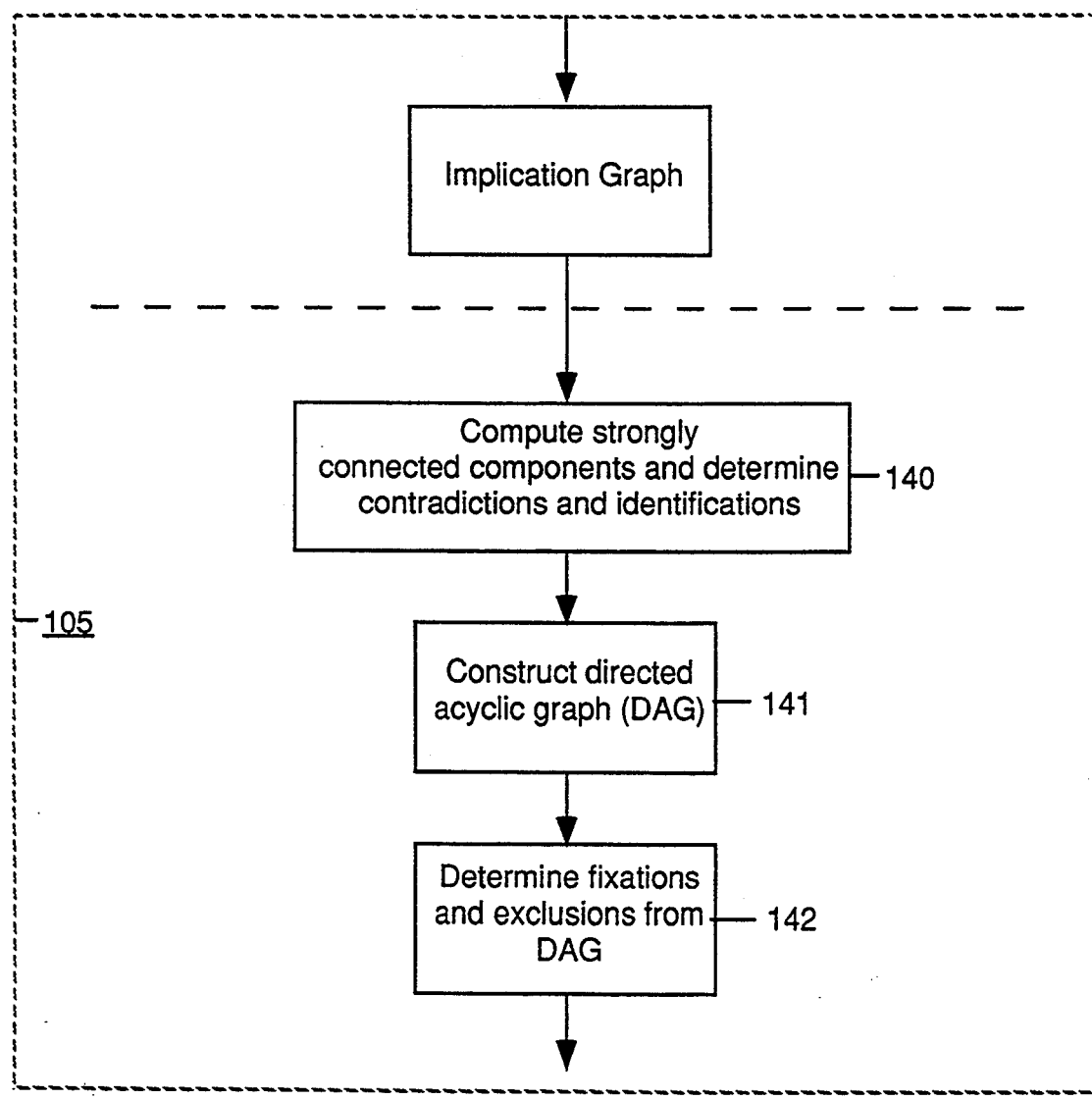
FIGS. 19–21 are flow diagrams for a preferred technique for the computation of transitive closure for use in the process described in FIG. 3.

The flow diagram of FIG. 19 includes three basic steps. The first step 140 involves computing the strongly connected components of the implication graph which had been derived in the preceding step 103. In a strongly connected component, every vertex in this set is reachable from every other vertex of the set. Step 140 will be discussed in more detail later. Once the strongly connected components have been determined, there is constructed a directed acyclic graph (DAG) as indicated by step 141 from which there are determined any fixations or exclusions as indicated by step 142. The operations involved in step 141 are described in the book entitled "The Design and Analysis of Computer Algorithms" by A. V. Aho et al, Addison-Wesley Publishing Company, Reading, Mass. (1974). Step 142 has been described earlier.

Figure 20:
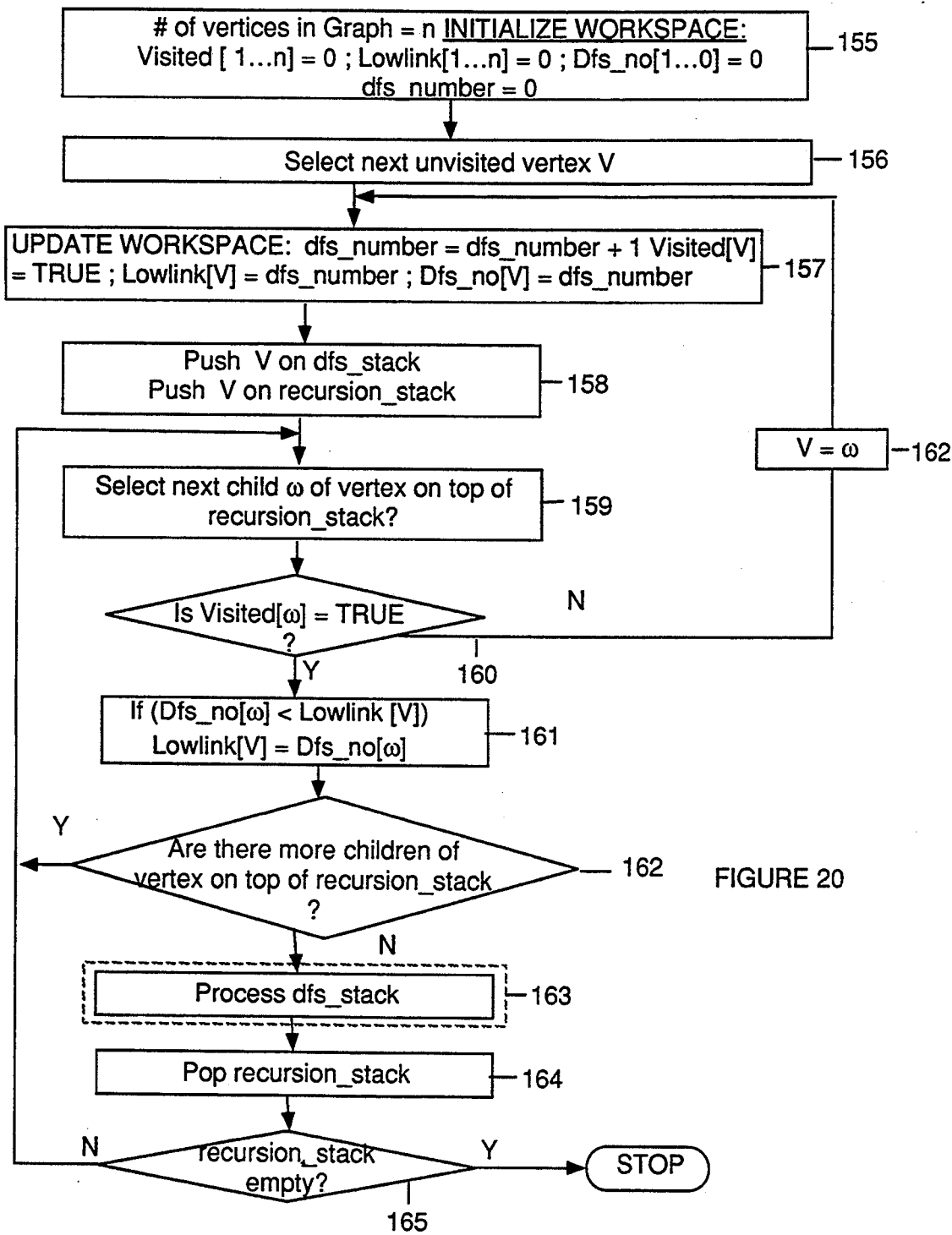

An illustrative process for determining the strongly connected components is described by the flow diagram of FIG. 20.

This process begins with step 155 by initializing a workspace to form three arrays each of size n, the number of vertices in the implication graph, whose transitive closure is to be computed. The arrays include a visited array for visited vertices, another termed the Lowlink array, and a third named the Dfs_no (depth first search) number, and initially all are set at zero.

Thereafter, per step 156 select one as yet unvisited vertex and per step 157 update the work space: mark the vertex being visited as true, set Lowlink of V and Dfs_no. of V to be equal to the Dfs_number.

Then as the next step 158, there is pushed the vertex V onto two separate stacks, called the dfs_stack and the recursion_stack.

Then as indicated by step 159, there is selected the child of the vertex on top of the recursion_stack. Per step 160, if the top of this stack had already been visited, we update the Lowlink value appropriately, as indicated by step 161. If not, the vertex V is relabeled as w per step 162 and we return to step 157.

After step 161 if there are additional children of the vertex on the top of the recursion_stack, we return to step 159, as indicated by step 162. If there are more children, we process the dfs_stack. This step 163 will be explained in more detail in connection with the flow diagram FIG. 21.

After such processing in step 163, we pop the recursion_stack as step 164. If it is already empty per step 165, we stop. Otherwise we return to step 159.

Figure 21:
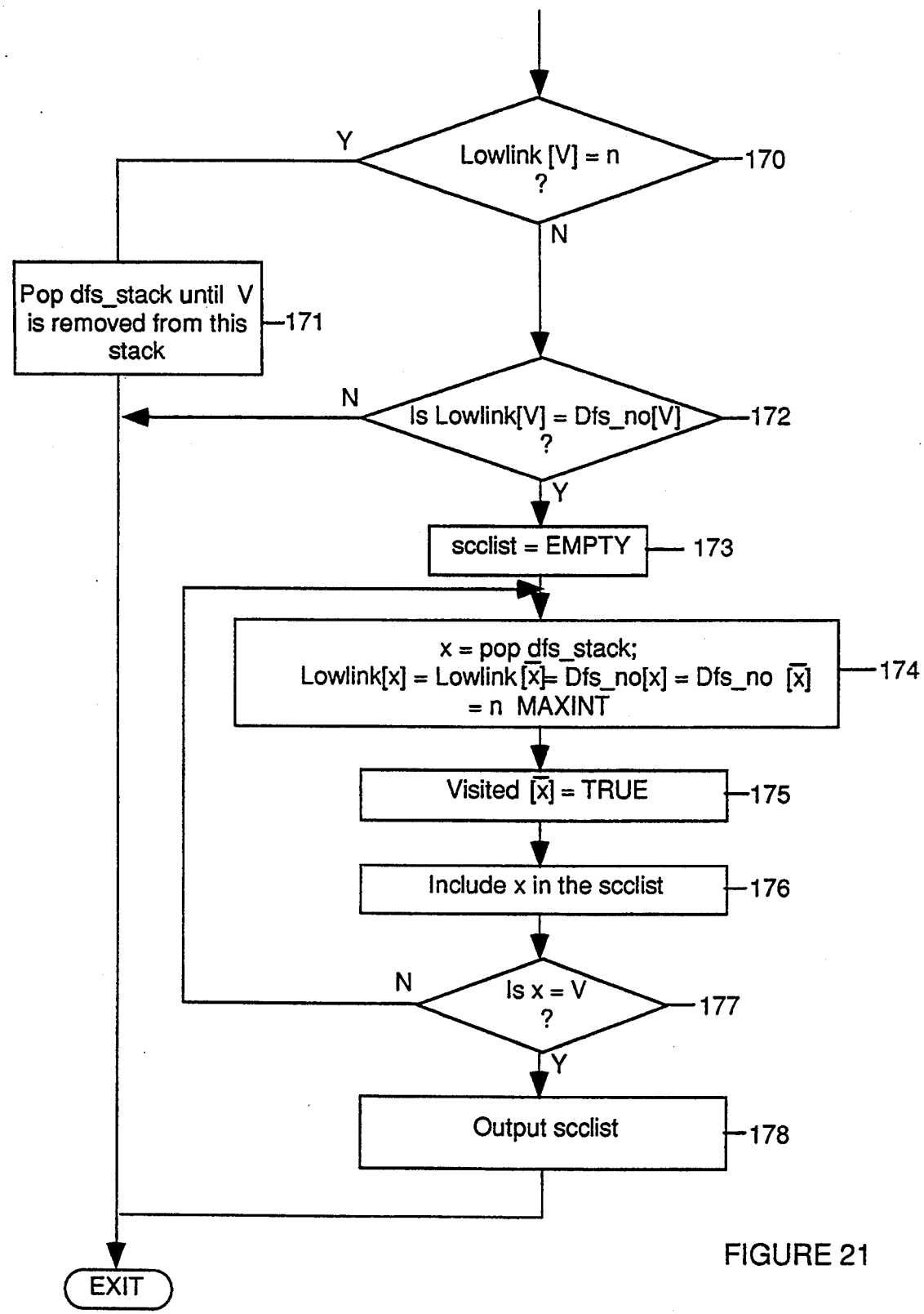

The details of the step of processing the dfs_sta, ck are shown in a separate flow chart as FIG. 21. Basically, the function of step 163 is to separate out all the strongly connected vertices and store them in a file, termed the acelist, from which they can be supplied for steps 164.

As step 170, we determine if the Lowlink of vertex V is equal to a number greater than n. If it is, per step 171 we pop the dfs_stack until vertex V is removed from this stack. As step 172, we determine if the Lowlink of vertex V is equal to the Dfs_no of vertex V. If it is, then we proceed to step 173 which sets the acelist to be empty. Step 174 involves popping the dfs_stack until the vertex V is at the top of the dfs_stack. All the vertices that come off the dfs_stack form a subset of vertices that are strongly connected as provided by steps 174, 175, 176, 177, and 178. These steps use the property that if a vertex is popped from the stack and it is not equal to V, then it is included in acelist. More specifically, in step 172 we have determined if Lowlink of vertex V is equal to its Dfs_no. If it is, per steps 174. 175, and 176, we process the vertex on the top of the dfs_stack. Per step 174, we pop a vertex x from the top of the dfs_stack. We then reassign Lowlink and Dfs_no of vertices x and of its complement to a number greater than n. Here, we chose MAXINT to be a number greater than n. As per step 175, we mark vertex x as visited and include vertex x in the list of vertices that form a strongly-connected component that includes vertex V. As per step 177, if the vertex on the top of the dfs_stack (step 176) is equal to vertex V, then we have determined all the vertices in the same strongly-connected component as vertex V. If it is not, we return to step 176 and repeat steps 175, 176 and 177.

FIG. 25 is a flow diagram 300 illustrating the use of the set of test vectors derived by use of the process shown in FIG. 2A and 2B, for testing the circuit for the individual faults for which the set of test vectors was designed. As a first step, illustrated by block 301, there is derived the set of test vectors as a series of ones and zeroes. Then each test vector of the set, in turn, is converted into a set of binary electrical pulses, as illustrated by block 302. Finally, these sets of binary electrical pulses are applied as an input to the circuit under test and the output of the circuit is examined to determine whether the circuit includes, or is free of, the fault for which the set of binary pulses was designed, as indicated by block 303.

It should be appreciated that the specific examples described are merely illustrative of the basic principles of the invention and that various other embodiments may be devised consistent with the basic principles of the invention.

What is claimed is:

1. A method for testing a logic circuit that comprises generating a test vector consisting of a set of signal values for a detecting a given fault in the logic circuit, where decisions on signal values are directed by a transitive closure computation on an implication graph model of the circuit, the decisions made from the class including fixations, identifications, exclusions and contradictions comprising the steps of (a) deriving a fault function version of the digital circuit and combining it with its fault free function version to form a composite function version of the digital circuit,
   (b) deriving the energy function of the composite function version and separating it into binary and ternary terms,
   (c) forming an implication graph of the binary terms of the energy function,
   (d) computing the transitive closure of the implication graph,
   (e) determining from the transitive closure any fixations, identifications, exclusions or contradictions and using any found to reduce some ternary terms of the energy function to new binary temps,
   (f) forming a new implication graph by adding to the previous implication graph the new binary terms,
   (g) computing a new transitive closure based on the new implication graph,
   (h) repeating steps (e), (f) and (g) so long as it is possible to remove ternary terms from the energy function,
   (i) if no ternary terms remain, deriving a list of literals,
   (j) if ternary terms remain, fixing an unassigned signal to a particular value and repeating steps (c), (d), (e), (f), (g), (h) and (i) and determining any redundancies fixations, identifications, exclusions or contradictions so long as ternary terms are being eliminated, and then deriving a list of literals,
   (k) if ternary terms remain, fixing the unassigned signal to the opposite value and repeating steps (c), (d), (e), (f), (g), (h) and (i)
   (l) from the list of literals, deriving a test vector for the fault, converting the test vector into an electrical signal, and, applying the electrical signal as an input to the logic circuit for testing for the fault and detecting the output of the logic signal to discern existence of a fault.

2. The method of claim 1 in which the testing is for a set of particular faults and the method for generating a test vector for a particular fault is repeated for each fault to derive a set of test vectors for testing for the set of particular faults and each of the set of derived test vectors is applied to the circuit under test and the output detected for discerning the corresponding fault.

3. The method of providing a digital circuit that is to be free of specific faults comprising, manufacturing a batch of said digital circuits, testing the integrity of each digital circuit for any of the faults by applying to the circuit a set of test vectors, each test vector of the set being designed to discover a different one of the particular faults, each of the test vector having been derived by a process that comprises
- (a) simulating a composite circuit that combines in parallel a version of the tested digital circuit that includes the particular fault with a version that is free of the particular fault,
- (b) deriving the energy function of the composite circuit by combining the energy functions of its logic gates and separating it into binary and ternary terms,
- (c) forming an implication graph of the binary terms of the energy function,
- (d) computing the transitive closure of the implication graph,
- (e) determining from the transitive closure any fixations, identifications, exclusions and contradictions and using any that are found to reduce ternary terms of the energy function to new binary terms,
- (f) forming a new implication graph by adding to it the new binary terms,
- (g) computing a new transitive closure based on the new implication graph,
- (h) repeating steps (e), (f) and (g) so long as it is possible to remove ternary terms from the energy function,
- (i) if ternary terms remain, fix an unassigned signal to a particular value and repeat the updating of she implication graph and the transitive closure, until all ternary terms are eliminated and there is derived a list of literals, and
- (j) from the list of literals, deriving a test vector for the fault, applying in turn the test vectors of the set to each digital circuit of the batch, detecting each output of each digital circuit for discerning whether the tested digital circuit includes any of the particular faults.

* * * * *